United States Patent [19]

Nakatsui et al.

[11] 4,430,666
[45] Feb. 7, 1984

[54] PHOTOELECTRIC CONVERTING DEVICE

[75] Inventors: Hisashi Nakatsui, Kawasaki; Yoshioki Hajimoto, Yokohama, both of Japan

[73] Assignee: Canon Kabushiki Kaisha, Tokyo, Japan

[21] Appl. No.: 350,727

[22] Filed: Feb. 22, 1982

[30] Foreign Application Priority Data

Feb. 27, 1981 [JP] Japan ................... 56-27752
Feb. 27, 1981 [JP] Japan ................... 56-27753
Feb. 27, 1981 [JP] Japan ................... 56-27754

[51] Int. Cl.³ ............................. H04N 9/07
[52] U.S. Cl. ............................. 358/44
[58] Field of Search ........................ 358/44

[56] References Cited

U.S. PATENT DOCUMENTS 4,064,521 12/1977 Carlson ................... 357/2
4,285,007 8/1981 Nakano et al. ........... 358/44

Primary Examiner—Richard Murray
Attorney, Agent, or Firm—Fitzpatrick, Cella, Harper & Scinto

[57] ABSTRACT

A photoelectric converting device comprises a substrate, a photoconductive layer constituted of an amorphous material having silicon atoms as a matrix provided on said substrate, a number of colorant layers provided separately per respective image elements on said photoconductive layer, image element electrodes which are provided on respective colorant layers for taking out electric signals separately for respective image elements corresponding to input light signals and counter-electrodes each to be coupled with each of said image element electrodes.

46 Claims, 10 Drawing Figures

PHOTOELECTRIC CONVERTING DEVICE

BACKGROUND OF THE INVENTION

1. Field of the Invention

This invention relates to a color separation type photoelectric converting device for obtaining color electric signals to be applied for a solid state image-pickup device which is used in color television cameras, etc.

2. Description of the Prior Art

In a single chip system solid state image-pickup device of prior art in which there is employed CCD (charge coupled device), color separation is effected by superposing a color filter array one to one on an image-pickup cell (photoelectric converting cell). In such solid state image-pickup device, even if the color filter elements constituting the color filter array may be completely superposed on the image-pickup cells constituting CCD, color mixing may occur due to leak of signals between respective image-pickup cells of CCD, whereby there results the problem of uncertainty in color separation.

Alternatively, there is also an attempt to provide a color filter array integrally on image-pickup cells of CCD. That is, this method comprises forming a dye-receiving layer of a polymer on CCD and coloring to a desired pattern using various dyes.

Further, as the methods for forming such patterns, there may be mentioned a coloring method in which dipping treatment is performed in a dye bath containing suitable dyes dissolved therein or a thermal transfer method in which a sublimable dye is placed close to or contacted with the portion to be colored and the dye is heated thereby to effect heat transfer of the dye.

There is also known a method wherein a dye, having a low vapor pressure and being difficulty pyrolyzable, is vapor deposited under vacuum on a substrate and then a desired pattern is prepared thereon by dry etching, thus forming a vapor deposited dye film having a desired pattern.

In any of these methods, however, it is essentially required to have CCD and image-pickup cells superposed on each other, whereby color mixing or uncertainty in color separation cannot disadvantageously be avoided.

SUMMARY OF THE INVENTION

An object of the present invention is to provide a photoelectric converting device, which has overcome the drawbacks of precision and cumbersome operations in superposition between a photoelectric converting cell corresponding to one image element and a color separation filter element corresponding to said cell, having integrally both functions of a color separation filter and a photoelectric converter and being markedly high in color separation precision with extremely high sensitivity in the desired photosensitive region.

According to one aspect of the present invention, there is provided a photoelectric converting device comprising:

a substrate;

a photoconductive layer constituted of an amorphous material having silicon atoms as a matrix provided on said substrate (hereinafter written as "a-Si");

a number of colorant layers provided separately per respective image elements on said photoconductive layer;

image element electrodes which are provided on respective colorant layers for taking out electric signals separately for respective image elements corresponding to input light signals; and counter-electrodes each to be coupled with each of said image element electrodes.

DETAILED DESCRIPTION OF THE PREFERRED EMBODIMENTS

Figure 1:
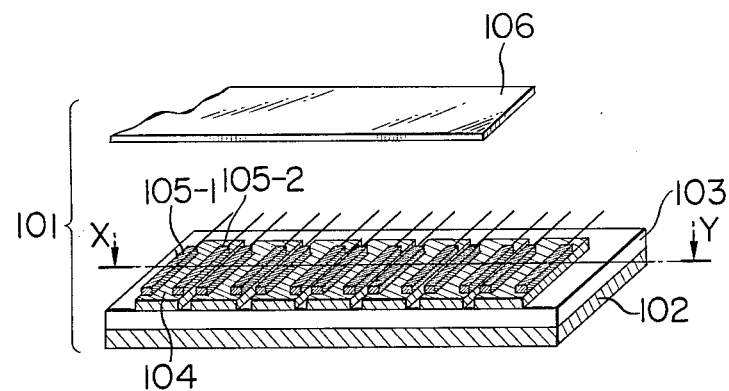
FIG. 1 shows a schematic perspective view of a preferred embodiment of the present invention.

Referring now to the drawings, the present invention is described in detail.

In FIG. 1, there is shown one preferred embodiment of a color separation type or photoelectric converting device arranged in an array having a narrow band spectral sensitivity according to the present invention. The photoelectric converting device arranged in an array indicated as a whole by 101 comprises a substrate 102, a photoconductive layer 103 constituted of a-Si, and further colorant layers 104 provided separately per respective image elements on the photoconductive layer 103, each colorant layer being provided thereon with a pair of electrodes 105-1, 105-2 for taking out electric signals. Each of colorant layers 104 is constituted of various colors corresponding to respective spectral sensitivities necessary for the photoelectric converting device 101 arranged in an array. In case of the embodiment as shown in FIG. 1, as shown in FIG. 2 which is a schematic sectional view taken along the chain line XY in FIG. 1, the three colorant layers of red (R), green (G) and blue (B) are arranged regularly in an array in the order of B, G and R on the photoconductive layer 103.

The photoelectric converting device according to the present invention may have a photosensitivity which is to be determined depending on a photoconductive layer of a-Si and the colorant layer laminated on the photoconductive layer. That is, by selection of the colorant constituting the colorant layer, it is possible to take not only various photosensitivities but also various ratios of bright resistibility to dark resistibility. Accordingly, for example, the spectral sensitivity distribution of red (R), green (G) and blue (B) and photosensitivity can freely be controlled as desired. Thus, it is possible to make a part of colors, for example, only G especially highly sensitive or to make the three colors of R, G and B uniform in photosensitivity.

Figure 2:
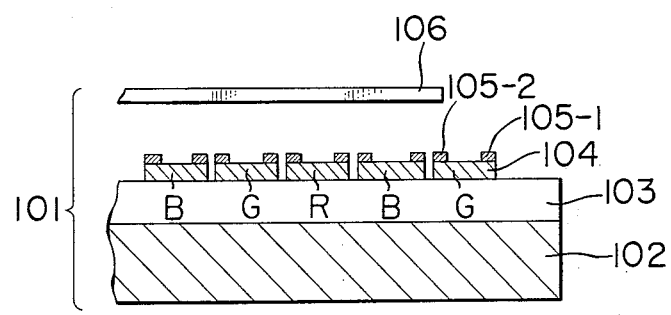
FIG. 2 a schematic sectional view taken along the chain line XY in FIG. 1.

In the present invention, as shown in FIG. 1 and FIG. 2, for the purpose of protection of the colorant layer 104 and electrode layers 105-1, 105-2 or for the purpose of obtaining a filter effect to cut UV-rays, it is preferred to provide an overcoat layer 106 made of a polymer resin on these layers (in the drawings, for avoiding complication, the overcoat layer 106 is shown apart from the electrodes 105-1, 105-2).

Figure 3:
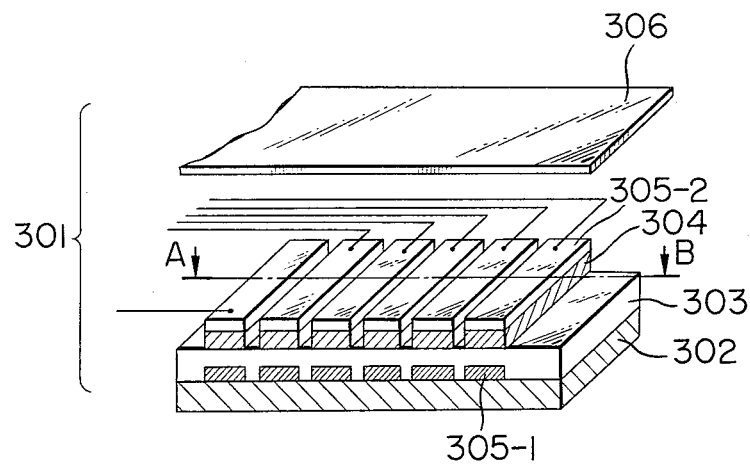
FIG. 3 a schematic perspective view of another preferred embodiment of the present invention.

FIG. 3 shows a schematic perspective view of another preferred embodiment of the present invention.

Figure 4:
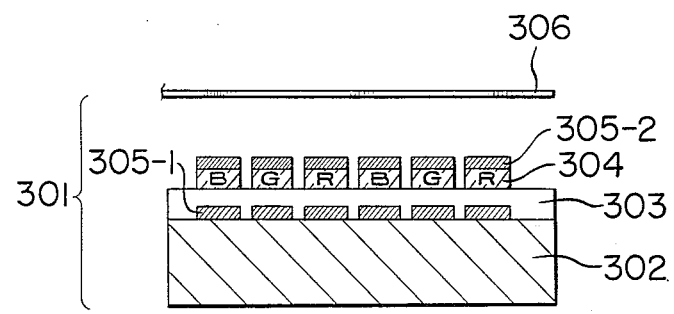
FIG. 4 a schematic sectional view taken along the chain line AB in FIG. 3.

FIG. 4 is a schematic sectional view taken along the chain line AB shown in FIG. 3.

The photoelectric converting device 301 according to the embodiment as shown in FIGS. 3 and 4 has a number of electrodes 305-1 provided separately per an image element on a substrate 302, a photoconductive layer 303 constituted of a-Si formed over the entire surface of the substrate 302 to cover on the electrodes 305-1, colorant layers 304 having desired color separation characteristic provided at a position to confront the electrodes 305-1 (in the drawings, arranged regularly in an array in the order of B, G and R), electrodes 305-2 provided on the colorant layers 304, and the overcoat layer 306 provided for covering all over the photoelectric converting device for protecting from the side of the electrodes 305-2 (in the drawings for avoiding complication, it is shown apart above the device).

In the photoelectric converting device 301 shown in FIGS. 3 and 4, the photoelectric converting cell constituting one image element corresponds to the section partitioned by a pair of electrodes 305-1 and 305-2.

Figure 5:
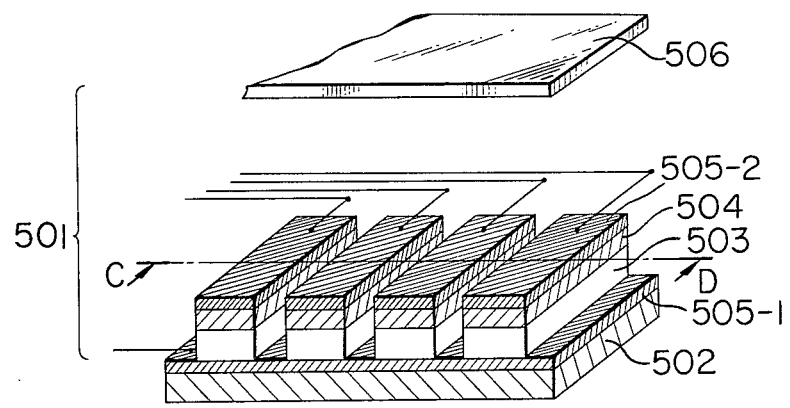
FIG. 5 a schematic perspective view of still another preferred embodiment of the present invention.
Figure 6:
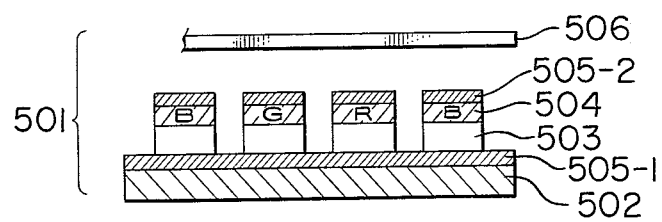
FIG. 6 a schematic sectional view taken along the chain line CD in FIG. 5.

FIG. 5 and FIG. 6 show still another preferred embodiment of the photoelectric converting device according to the present invention.

FIG. 5 is a schematic perspective view similarly as FIG. 1 or FIG. 3.

FIG. 6 is a schematic sectional view taken along the chain line CD shown in FIG. 5.

As contrasted with the constitution of the embodiment as shown in FIGS. 3 and 4 wherein there are provided an elongated photoconductive layer 303 in a continuous state commonly on respective photoelectric converting cells (corresponding to one image element), colorant layers 304 provided separately per each image element layer on said photoconductive layer 303, and a pair of electrodes 305-1 and 305-2 holding these photoconductive layer 303 and colorant layers 304 interposed therebetween, the photoelectric converting device 501 according to the embodiment as shown in FIGS. 5 and 6 has the following constitution. That is, on a substrate 502, there is provided an electrode 505-1 common to respective image elements, and on said common electrode 505-1, there are laminated, separately per each image element, photoconductive layers 503 of a-Si, colorant layers 504 and image element electrodes 505-2, in the order mentioned.

In case of the photoelectric converting device 501, similarly as the photoelectric converting devices shown in FIG. 1 or FIG. 3, an overcoat layer 506 is provided, if desired, from the side of the electrode 505-2 in order to cover all over the device for the purpose of mechanical protection. The overcoat layer 506 is also shown apart from the device similarly as in FIG. 1 or FIG. 3 for the purpose of avoiding complication in the drawing.

Figure 7:
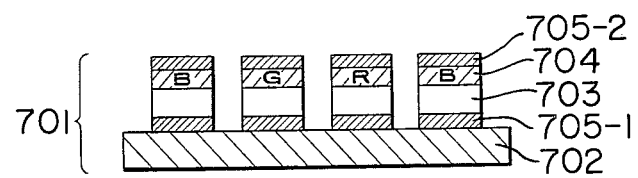
FIG. 7 a schematic sectional view of another embodiment of the present invention.

The photoelectric converting device 701 shown in FIG. 7 is a modification of the photoelectric converting device 501 shown in FIGS. 5 and 6, and different from the embodiments shown in FIGS. 5 and 6 in that the electrode 705-1 is separated per each image element while the electrode 501-1 shown in FIGS. 5 and 6 is common to respective image elements, being otherwise the same in constitution.

In the following, the photoconductive layer and the colorant layer constituting the photoelectric converting device according to the present invention are to be described in detail.

According to preferred embodiments of the present invention, the photoconductive layer of a-Si constituting the photoelectric converting device of the present invention is first formed on a substrate subjected to a desirable pre-treatment for a photoelectric converting device by the glow discharge method, the sputtering method, the ion-plating method, the reactive electron beam vapor deposition method, the CVD method, etc.

In the present invention, it is preferred that either one of hydrogen atoms (H) or halogen atoms (X) may be contained in the photoconductive layer constituted of a-Si.

In the present invention, typical examples of halogen atoms (X) which may optionally be incorporated in the photoconductive layer are fluorine, chlorine, bromine and iodine, especially preferably fluorine and chlorine.

In the present invention, as the basic procedure forming a photoconductive layer constituted of a-Si by the glow discharge method, a starting gas for supplying silicon atoms (Si) is introduced, optionally together with a starting gas for incorporation of hydrogen atoms (H) or/and halogen atoms (X) into a deposition chamber which can be internally brought to reduced pressure, wherein glow discharge is generated thereby to form a layer of a-Si on the surface of a substrate placed at a predetermined position in the chamber. When it is to be formed by the sputtering method, sputtering may be effected upon the target formed of Si in an atmosphere of an inert gas such as Ar, He or a gas mixture based on these gases or alternatively with introducing additionally a starting gas for incorporation of hydrogen atoms (H) or/and halogen atoms (X) into the chamber for sputtering, during sputtering.

The starting gas for supplying Si to be used in the present invention may include gaseous or gasifiable hydrogenated silicons (silanes) such as $SiH_4$, $Si_2H_6$, $Si_3H_8$ $Si_4H_{10}$ and others as effective materials. In particular, $SiH_4$ and $Si_2H_6$ are preferred with respect to easy handling during layer formation, efficiency for supplying Si, and the like.

As the effective starting gas for incorporation of halogen atoms to be used in the present invention, there may be mentioned a number of halogen compounds such as halogen gases, halides, interhalogen compounds and silane derivatives substituted with halogens which are gaseous or gasifiable.

Alternatively, it is also effective in the present invention to use a gaseous or gasifiable silicon compound containing halogen atoms, which is constituted of both silicon atoms and halogen atoms.

Typical examples of halogen compounds preferably used in the present invention may include halogen gases such as fluorine, chlorine, bromine or iodine and interhalogen compounds such as BrF, ClF, $ClF_3$, $BrF_5$, $BrF_3$, $IF_3$, $IF_7$, ICl, IBr, etc.

As the silicon compound containing halogen atom, namely so-called silane derivatives substituted with halogen atoms, silicon halides such as $SiF_4$, $Si_2F_6$, $SiCl_4$, $SiBr_4$, and the like are preferred.

When the photoconductive member constituted of a-Si according to the present invention is formed by the glow discharge method by use of such a silicon compound containing halogen atoms, it is possible to form a photoconductive layer constituted of a-Si containing halogen atoms (X) without use of a hydrogenated silicon gas as the starting gas capable of supplying Si.

In forming the photoconductive layer containing halogen atoms by the glow discharge method, the basic procedure comprises introducing a starting gas for supplying Si, namely, a gas of silicon halide and a gas such as Ar, $H_2$, He, etc. at a predetermined ratio in a suitable amount into the deposition chamber for formation of a photoconductive layer, followed by excitation of glow discharge to form a plasma atmosphere of these gases, thereby forming a photoconductive layer on a substrate. It is also possible to form a layer by mixing additionally a gas of a silicon compound containing hydrogen atoms at a suitable ratio with these gases in order to incorporate hydrogen atoms therein.

Each of the gases for introduction of respective atoms may be either a single species or a mixture of plural species at a predetermined ratio.

For formation of a photoconductive layer of a-Si by the reactive sputtering method or the ion-plating method, for example, a target of Si is used and sputtering is effected thereon in a predetermined gas plasma atmosphere in case of the sputtering method. Alternatively, in the case of the ion-plating method, a polycrystalline or single crystalline silicon is placed as vaporization source in a vapor deposition boat, and the silicon vaporization source is vaporized by heating by the resistance heating method or the electron beam method (EB method) thereby to pemit vaporized flying substances to pass through a predetermined gas plasma atmosphere.

During this procedure, in either of the sputtering method or the ion-plating method, for incorporation of halogen atoms into the layer formed, a gas of a halogen compound as mentioned above or a silicon compound containing halogen as mentioned above may be introduced into the deposition chamber to form a plasma atmosphere of the gas therein.

When hydrogen atoms are to be incorporated, a starting gas for incorporation of hydrogen atoms such as $H_2$ and a gas such as silanes as mentioned above may be introduced into the deposition chamber for sputtering, followed by formation of a plasma atmosphere of said gases.

In the present invention, as the starting gas for incorporation of halogen atoms, the halogen compounds or silicon compounds containing halogens as mentioned above can effectively be used. In addition, it is also possible to use a gaseous or gasifiable halide containing hydrogen atom as one of the constituents such as hydrogen halide, including HF, HCl, HBr, HI and the like or halogen-substituted hydrogenated silicon, including $SiH_2F_2$, $SiH_2I_2$, $SiH_2Cl_2$, $SiHCl_3$, $SiH_2Br_2$, $SiHBr_3$ and the like as an effective starting material for formation of a photoconductive layer.

These halides containing hydrogen atom, which can incorporate hydrogen atoms very effective for controlling electrical of photoelectrical characteristics into the layer during formation of the photoconductive layer simultaneously with incorporation of halogen atoms, can preferably be used as the starting material for incorporation of halogen atoms.

For incorporation of hydrogen atoms structurally into the photoconductive layer, $H_2$ or a gas of hydrogenated silicon, including $SiH_4$, $Si_2H_6$, $Si_3H_8$, $Si_4H_{10}$ and so on may also be permitted to be co-present with a silicon compound for supplying Si in a deposition chamber, wherein discharging is excited.

For example, in case of the reactive sputtering method, a target of Si is used and a gas for incorporation of halogen atoms and $H_2$ gas are introduced together with, if necessary, an inert gas such as He, Ar, etc. into the deposition chamber, wherein a plasma atmosphere is formed to effect sputtering of the target of Si, thereby forming a photoconductive layer of a-Si containing halogen atoms and hydrogen atoms on the substrate.

Further, there may also be introduced a gas such as of $B_2H_6$ or others in order to effect also addition of impurities.

The amount of hydrogen atoms (H) or halogen atoms (X) or total amount of both of these atoms (H+X) incorporated in the photoconductive layer in the photoconductive member according to the present invention may be preferably 1 to 40 atomic %, most preferably 5 to 30 atomic %.

The photoconductive layer constituted of a-Si can be controlled to a desired conduction type by adding an impurity for controlling the conduction type into the layer during formation of the layer.

As the impurity to be added into the photoconductive layer to make it inclined for p-type, there may be mentioned preferably an element in the group III of the periodic table, for example, B, Al, Ga, In, Tl, etc.

On the other hand, for making the layer inclined for n-type, there may preferably be used an element in the group V of the periodic table, such as N, P, As, Sb, Bi, etc.

Since these impurities are included in the photoconductive layer of a-Si in an amount of ppm order, it is not necessary to pay so much attention to its environmental pollution as that of the principal material constituting the layer, although use of a material causing as little environmental pollution as possible is preferable. From such point, for example, there may preferably be used B, As, P, Sb, etc. taking electric and optic characteristics of the photoconductive layer of a-Si into consideration.

The amount of the impurity to be added into the photoconductive layer of a-Si is suitably selected depending on the electric and optic characteristics. In the case of an impurity in the group III of the periodic table, the amount of the impurity to be added is $10^{-6} \sim 10^{-3}$ atomic %, preferably $10^{-5} \sim 10^{-4}$ atomic %. In the case of an impurity of the group V of the periodic table, the amount of the impurity to be added is $10^{-8} \sim 10^{-5}$ atomic %, preferably $10^{-8} \sim 10^{-7}$ atomic %. The thickness of the photoconductive layer of a-Si is generally $0.5 \sim 10\mu$, preferably $1 \sim 5\mu$.

In the present invention, for forming a colorant layer provided on a photoconductive layer in a state that the colorant layer directly contacts on the photoconductive layer, there are effectively used the heat transfer method in which a sublimable dye is approached to or contacted on the surface of a photoconductive layer and the dye is heated thereby to effect heat transfer thereof; and further the vacuum deposition method in which a layer of difficulty pyrolyzable dye or pigment is formed by vacuum deposition on a photoconductive layer. The vacuum deposition is a convenient method, since the layer thickness can easily be controlled as desired with a good precision.

In the present invention, when the colorant layer is formed by vapor deposition of a dye or a pigment, the degree of vacuum may be preferably $10^{-4}$ to $10^{-5}$ Torr and the heating temperature within the range of 250 to 500° C. The layer formed may have a thickness of 0.2 to 10$\mu$, preferably 0.5 to 2$\mu$.

The typical organic colorants used effectively for preparing the colorant layer in the present invention include:

Blue colorants;
Siminol Leveling Blue R (supplied by Sumitomo Chemical Co. Ltd.),
Suminol Fast Navy (supplied by Sumitomo Chemical Co. Ltd.),
Patent Blue AF (supplied by BASF),
Acilan Astol B (supplied by FBy.),
Aizen Basic Cyanine 6GH (supplied by Hodogaya Chemical Co. Ltd.),
Methylene Blue FZ (supplied by Sumitomo Chemical Co. Ltd.),
Sevron Blue 2G (supplied by E. I. du Pont de Nemours & Co. Inc.),
Diacryl Supra Blue 5GL (supplied by Mitsubishi Chemical Industrial Ltd.),
Direct Cupper Blue 2B (supplied by Sumitomo Chemical Co. Ltd.),
Durazol Blue 2GN (supplied by I.C.I. Ltd.),
Kayaras Supra Blue BWL (supplied by Nippon Kayaku Co. Ltd.),
Benzo New Blue 5BS (supplied by FBy),
Nihonthrene Blue GCD (supplied by Sumitomo Chemical Co. Ltd.),
Carbonol Blue LBN (supplied by Nippon Kayaku Co. Ltd.),
Indanethrene Blue RS-D (supplied by BASF),
Mitsui Vat Brilliant Blue 4G (supplied by Mitsui-Toatsu Chemicals Inc.),
Sumikaron Blue S-3RF (supplied by Sumitomo Chemical Co. Ltd.),
Terasil Blue BG (supplied by Ciba-Geigy Ltd.),
Latyl Blue BCN (supplied by E. I. du Pont de Nemours & Co. Ltd.),
Kayalon Fast Blue FN (supplied by Nippon Kayaku Co. Ltd.),
Cibanone Dark Blue MB (supplied by Ciba-Geigy Ltd.),
Sumitone Fast Blue RS (supplied by Sumitomo Chemical Co. Ltd.),
Mikethrene Blue GCD (supplied by Mitsui-Toatsu Chemicals Inc.), and the like;
Red Colorants;
Suminol Fast Red B conc. (supplied by Sumitomo Chemical Co. Ltd.),
Sumiacryl Red N-RL (supplied by Sumitomo Chemical Co. Ltd.),
Aizen Cathilon Phloxine FF (supplied by Hodogaya Chemical Co. Ltd.),
Direct Scarlet BA (supplied by Sumitomo Chemical Co. Ltd.),
Chlorazol Red Bk (supplied by I. C. I. ltd.),
Benzo Rubine 6BS (supplied by FBy.),
Mitsui Direct Scarlet 3BX (supplied by Mitsui-Toatsu Chemical Inc.),
Nihonthrene Red FBB (supplied by Sumitomo Chemical Co. Ltd.),
Cibanone Brilliant Pink R (supplied by Ciba-Geigy Ltd.),
Sumikaron Red S-GG (supplied by Sumitomo Chemical Co. Ltd.),
Diacelliton Red R (supplied by Mitsubishi Chemical Industrial Ltd.),
Lurafix Red BF (supplied by BASF),
Cibacet Red 2G (supplied by Ciba-Geigy Ltd.),
Kayalon Fast Scarlet B (supplied by Nippon Kayaku Co. Ltd.),
Sumitone Carmine B (supplied by Sumitomo Chemical Co. Ltd.),
Dainichi No. 930 Fast Red (supplied by Dainichi Seika),
Chromophthal Red 2RF (supplied by Ciba-Geigy Ltd.),
Sinquasia Red Y (supplied by E. I. du Pont de Nemours & Co. Ltd.),
No. 601 Deep Red Violet (supplied by Toko Ink Co. Ltd.), and the like;
Green Colorants;
Suminol Milling Brilliant Green 5G (supplied by Sumitomo Chemical Co. Ltd.),
Acilan Green SFG (supplied by FBy.),
Diacid Fast Green GW (supplied by Mitsubishi Chemical Industrial Ltd.),
Erio Green SN (supplied by Ciba-Geigy Ltd.),
Aizen Diamond Green GH (supplied by Hodogaya Chemical Co. Ltd.),
Astra Malachite Green B (supplied by FBy.),
Sumiacryl Brilliant Green B (supplied by Sumitomo Chemical Co. Ltd.),
Aizen Direct Green BH (supplied by Hodogaya Chemical Co. Ltd.),
Mitsui Direct Green GC (supplied by Mitsui-Toatsu Chemical Inc.),
Durazol Green 5B (supplied by I. C. I.),
Benzamin Fast Green GFL (supplied by FBy.),
Nihonthrene Brilliant Green B (supplied by Sumitomo Chemical Co. Ltd.),
Mikethrene Brilliant Green GG (supplied by Mitsui-Toatsu Chemical Inc.),
Resolin Green C-FGS (supplied by FBy.),
Dainichi Cyanine Green FG (supplied by Dainichi Seika Co. Ltd.),
Sumitone Fast Green-Yellow 5G (supplied by Sumitomo Chemical Co. Ltd.),
Cyanine Green Toner (supplied by Toyo Ink. Co. Ltd.), and the like;
Yellow Colorants;
Suminol Milling Yellow O (supplied by Sumitomo Chemical Co. Ltd.),
Acilan Yellow GG (supplied by FBy.),
Palatine Fast Yellow GRN (supplied by BASF),
Fluoresceine SP (supplied by I. C. I.),
Mitsui Metanil Yellow (supplied by Mitsui-Toatsu Chemical Inc.),
Sumiacryl Yellow N-3RL (supplied by Sumitomo Chemical Co. Ltd.),
Celliton Fast Yellow G (supplied by BASF),
Kayalon Fast Yellow GL (supplied by Nippon Kayaku Co. Ltd.),
Aizen Cathilon Yellow 3GLH (supplied by Hodogaya Chemical Co. Ltd.),
Maxilon Yellow 5GL (supplied by Ciba-Geigy Ltd.),
Chrysophenine (supplied by Sumitomo Chemical Co. Ltd.),
Chlorazol Yellow 3G (supplied by I. C. I.), Stilbene Yellow GX (supplied by E. I. du Pont de Nemours & Co. Ltd.),
Mitsui Direct Fast Yellow BC (supplied by Mitsui-Toatsu Chemical Inc.),
Benzo Viscose Yellow RL (supplied by FBy.),
Nihonthrene Yellow 3GC (supplied by Sumitomo Chemical Co. Ltd.),
Cibanon Yellow GC (supplied by Ciba-Geigy Ltd.),
Sumikaron Yellow S-R (supplied by Sumitomo Chemical Co. Ltd.),
Celliton Fast Yellow G (supplied by BASF),
Terasil Golden Yellow RL (supplied by Ciba-Geigy Ltd.),
Miketon Fast Yellow GL (supplied by Mitsui-Toatsu Chemical Inc.),
Dainichi Fast Yellow G (supplied by Dainichi-Seika Co. Ltd.),
Chromophthal Yellow A2R (supplied by Ciba-Geigy Ltd.),
Paliogen Yellow RT (supplied by BASF), and the like;
Magenta Colorants;
Solar Acid Scarlet BA (supplied by Sumitomo Chemical Co. Ltd.),
Acilan Scarlet V3R (supplied by FBy.),
Aizen Acid Rhodamine BH (supplied by Hodogaya Chemical Co. Ltd.),
Erioshin Scarlet 4R (supplied by Ciba-Geigy Ltd.),
Rhodamine 6G (supplied by Ciba-Geigy Ltd.),
Rhodamine F4G (supplied by BASF),
Kayaku Direct Fast Scarlet 4BS (supplied by Nippon Kayaku Co. Ltd.), and the like;
Cyan Colorants;
2, 3-Dimethyl-quinoxaline,
2-Hydroxy-3-amino-phenazine,
Hydroxy-amino-naphthazine sulfonic acid, and the like.

In the present invention, each colorant as described above may be used singly or in combination.

The typical materials for forming an electrode disposed on a substrate according to the present invention include metals such as Al, Cr, Mo, Au, Nb, In, Ta, V, Ti, Pt, Pd, and the like, and alloys thereof such as stainless steel and the like. Electrodes disposed on a colorant layer 104 are made of a translucent film of the above-mentioned metals or alloys, or a transparent film of $In_2O_3$, $Sn_2O_3$, and the like. It is preferable to use $In_2O_3$ by the ion-plating process which can be effected at lower temperature.

The process for preparation of the photoelectric converting device is now described in detail by referring to one preparation example of a photoelectric converting device having the same structure as shown in FIG. 1 and FIG. 2.

First, a glass substrate 102 having a cleaned surface was fixed at a predetermined position in a conventional vapor deposition tank for glow discharge. Then Ar gas and $SiH_4$ gas were introduced into the vapor deposition tank. Subsequently, the high frequency power source was turned on to apply a high frequency power of 13.56 MHz between a pair of electrodes to form a photoconductive layer 103 constituted of a-Si. The glow discharge current was thereby about 5 mA/cm$^2$ at a voltage of 2000 V, whereby the growth rate of the layer was 4 Å/sec., and it took about 3.5 hours to form the layer. As the result, there was formed a photoconductive layer 103 constituted of a-Si having a thickness of 5μ.

As the next step, using a conventional resistance heating type vapor deposition device, vapor deposition of the following dyes and pigments was performed to form colorant layers 104 corresponding to respective colors. That is, under a vacuum of $5 \times 10^{-4}$ Torr, lead-phthalocyanine was vapor deposited through a stainless mask having a desired image element pattern at room temperature to form colorant layers at the predetermined positions on the photoconductive layer 103 constituted of a-Si. The layer thickness obtained was 0.4μ.

Subsequently, according to a similar procedure, there were formed at the predetermined positions on the photoconductive layer 103 other colorant layers consisting of Cu-phthalocyanine. Further, other colorant layers consisting of Rhodamine 6G were formed at the predetermined positions on the photoconductive layer 103, whereby the vapor deposited layers had a thickness of 0.8μ.

Finally, electrodes 105-1 and 105-2 for taking out output signals were formed using aluminum on each colorant layer.

In this case, each of the colorant layers 104 formed in an array was designed to have a one side length of 10μ, and the distance between the pair of electrodes 105-1 and 105-2 formed on respective colorant layers was made 5μ. But it is also possible to make the size of each side length of respective colorant layers 104 to any desired value of 20μ or less, depending on the intended purpose, and also the interelectrode distance to a desired value within 3 to 20μ.

Figure 8:
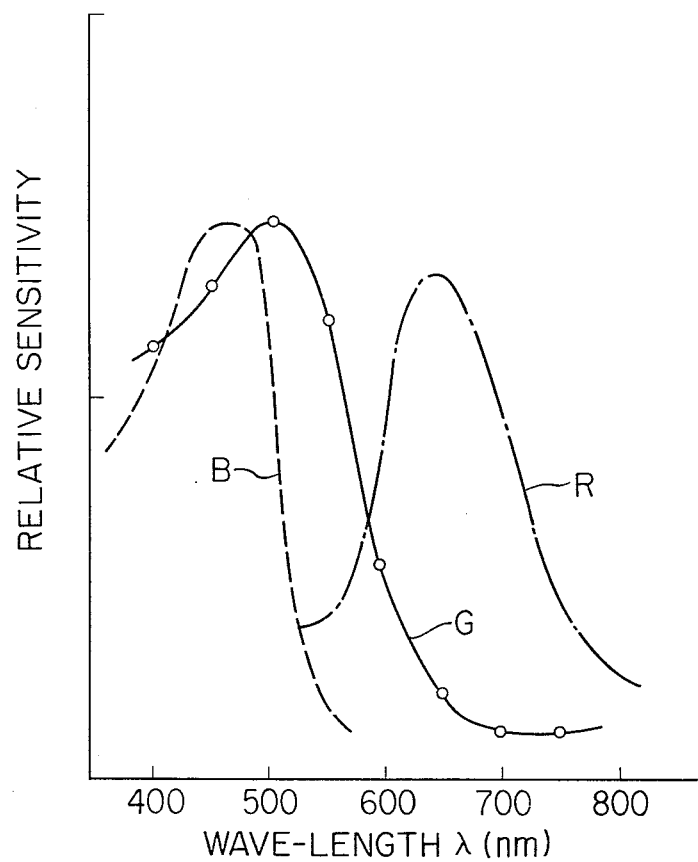
FIG. 8 a graph indicating an example of spectral sensitivity of the photoconductive element of the present invention.

In FIG. 8, there are shown spectral sensitivity characteristics when electric signals outputted corresponding to optical signals by the light with respective wavelength at R, G and B sections in the photoelectric converting device as prepared above were detected as output signals.

Next, preparation of the photoelectric converting device is described in detail by referring to one preparation example of a photoelectric converting device having the same structure as shown in FIGS. 3 and 4.

A glass substrate 302 having previously vapor deposited electrodes 305-1 in a desired image element pattern was fixed at a predetermined position in a conventional vapor deposition tank for glow discharge. Then Ar gas and $SiH_4$ gas were introduced into the vapor deposition tank. Subsequently, the high frequency power source was turned on to apply a high frequency power of 13.56 MHz between a pair of electrodes to form a photoconductive layer 303 constituted of a-Si to a state as shown in FIG. 4. The glow discharge current was thereby about 5 mA/cm$^2$ at a voltage of 2000 V, whereby the growth rate of the layer was 4 Å/sec. and it took about 40 minutes to form the layer. As the result, there was formed a photoconductive layer 303 constituted of a-Si having a thickness of 1μ.

As the next step, using a conventional resistance heating type vapor deposition device, vapor deposition of the following dyes and pigments was performed to form colorant layers 304 corresponding to respective colors. That is, under a vacuum of $5 \times 10^{-4}$ Torr, lead-phthalocyanine was vapor deposited through a stainless mask having a desired image element pattern at room temperature to form green colorant layers at the predetermined positions on the photoconductive layer 303 constituted of a-Si. The layer thickness obtained was 0.4 μm. Subsequently, according to a similar procedure, there were formed at the predetermined positions on the photoconductive layer 303 blue colorant layers by vapor deposition of Cu-phthalocyanine. Further, red colorant layers were formed at the predetermined positions on the photoconductive layer 303 by vapor deposition of Rhodamine 6G, whereby the layer thickness was 0.8μ.

Finally, electrodes 305-2 were formed using In$_2$O$_3$ for taking out output signals corresponding to input light signals on each image element. Formation of the transparent electrodes of In$_2$O$_3$ was performed by first setting a substrate subjected the above-mentioned procedures at a predetermined position in a vapor deposition device, followed by introduction of oxygen gas until reaching a desired gas pressure, and commencing vapor deposition of electron beam by forming a discharging state by application of a high frequency power when the pressure in the bell jar reached $10^{-3}$ Torr. The electrodes were formed under conditions of the background pressure of $5 \times 10^{-5}$ Torr, O$_2$ partial gas pressure of $1 \times 10^{-4}$ Torr, RF-output power of 150 W, and vapor deposition rate of 5 Å/sec. Formation of the electrode was completed within about 30 minutes.

Figures 9, 10:
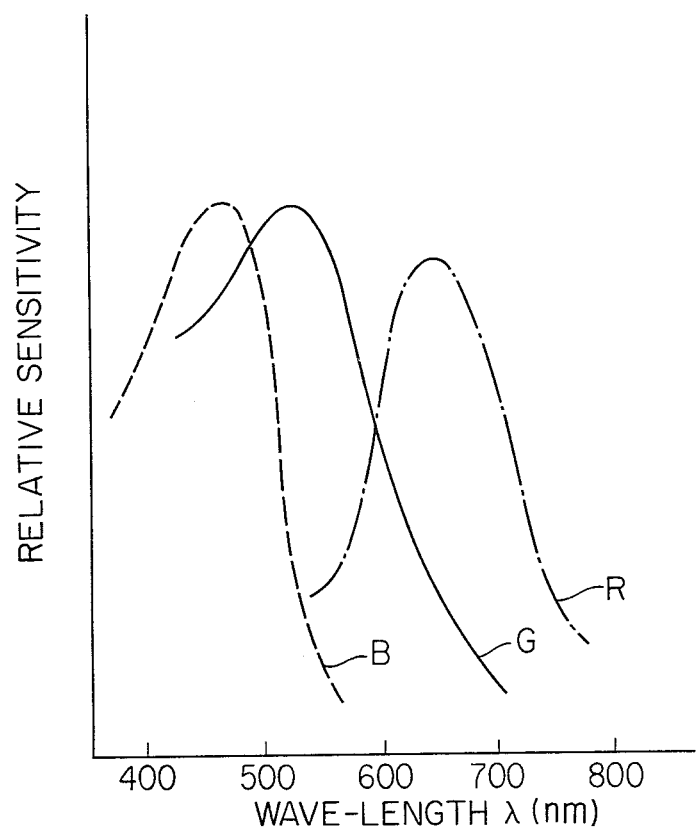
FIG. 9 a graph showing spectral sensitivity characteristics.
FIG. 10 a schematic illustration of an example of an arranged pattern of colorant layers.

FIG. 9 shows spectral sensitivity characteristics of the photoelectric converting device as prepared above. As apparent from this Figure, there can be formed a photoelectric converting device excellent in color separation ability having narrow band spectral sensitivities at blue(B), green(G) and red(R).

Preparation of the photoelectric converting device is further described in detail below by referring to one preparation example of a photoelectric converting device having the same structure as shown in FIG. 5 and FIG. 6.

First, a glass substrate 502 having a cleaned surface and a common electrode 501-1 formed thereon was fixed at a predetermined position in a conventional vapor deposition tank for glow discharge. Then, Ar gas and SiH$_4$ gas were introduced into the vapor deposition tank. Subsequently, the high frequency power source was turned on to apply a high frequency power of 13.56 MHz between a pair of electrodes to form a photoconductive layer 503 constituted of a-Si. The glow discharge current was thereby about 5 mA/cm$^2$ at a voltage of 2000 V, whereby the growth rate of the layer was 4 Å/sec, and it took about 1.4 hours to form the layer. As the result, there was formed a photoconductive layer 503 constituted of a-Si having a thickness of 2μ.

As the next step, using a conventional resistance heating type vapor deposition device, vapor deposition of the following dyes and pigments was performed to form respective colorant layers 504. That is, under a vacuum of $5 \times 10^{-4}$ Torr, lead-phthalocyanine was vapor deposited through a stainless mask having a desired image element pattern at room temperature to form colorant layers at the predetermined positions on the photoconductive layer. The layer thickness obtained was 0.4μ. Subsequently, according to a similar procedure, there were formed at the predetermined positions on the photoconductive layer other colorant layers by effecting vapor deposition of Cu-phthalocyanine. Further, according to a similar procedure, Rhodamine 6G was vapor deposited at the predetermined positions on the photoconductive layer to form still other colorant layers to a thickness of 0.8μ.

Finally, the electrode 505-2 for taking out output signals from respective image elements was formed with In$_2$O$_3$ according to the ion-plating method.

Then, with vacuum being broken, the substrate 502 having undergone the above treatments was taken out from the vacuum tank. After coating of the photoresist OMR-83 (trade name: produced by Tokyo Oka), through a photomask having a desired image element pattern, the substrate was subjected to exposure to light from a mercury lamp, followed by the step of development, thereby to form the image pattern of photoresist on the In$_2$O$_3$ transparent electrode layer.

As the next step, the In$_2$O$_3$ transparent electrode on the portion without being covered by the photoresist was removed by etching with 0.1 N, NCl aqueous solution and the photoconductive layer of a-Si was treated with the etchant CP-4 to effect etching on the portion on which no photoresist had been covered, thus removing the In$_2$O$_3$ transparent electrode layer and the photoconductive layer of a-Si according to the image element pattern from the electrode 505-1.

During these procedures, the colorant layer on the photoconductive layer of a-Si can be simultaneously removed with etching of the In$_2$O$_3$ transparent layer. When it is difficulty removable, it may separately be removed by dissolving with alcohol.

After etching, the etched product was thoroughly dried and the photoresist was removed by a peeling liquid.

The ion-plating conditions during formation of the In$_2$O$_3$ electrode were $5 \times 10^{-5}$ of background pressure, $1 \times 10^{-4}$ Torr of O$_2$ gas pressure, 150 W of RF-output, 5 Å/sec. of vapor deposition rate. The electrode was formed within about 30 minutes.

Referring now to a example of a photoelectric converting device having the same structure as shown in FIG. 7, an aluminum electrode was previously formed by vapor deposition to a width of 60μ and a thickness of 2000 Å on a clean glass substrate 702. Then, after coating of the photoresist OMR-83 (trade name: produced by Tokyo Oka) and patterning, etching of the aluminum electrode was effected thereby to form an image element electrode group as shown in FIG. 7. Etching was performed using an etchant comprising phosphoric acid, nitric acid, acetic acid, and water (16:1:2:1 by volume ratio) heated to about 40° C. by immersing the substrate therein for 30 seconds.

After patternization of the aluminum electrode, SiH$_4$ and PH$_3$ gases were introduced into a vacuum tank to maintain the pressure in the vacuum tank at 1 Torr. Then, glow discharge was excited in the vacuum deposition tank by supplying a high frequency power of 13.56 MHz to an induction coil wound up outside of the vapor deposition tank thereby to form a n-type a-Si layer to a thickness of 800 Å on the whole surface of the substrate 702 on which the aluminum image element electrodes 705-1 had been formed. Further, with gas introduction of PH$_3$ being stopped, glow discharging was subsequently continued in an atmosphere of only SiH$_4$ gas thereby to form an n$^-$-type a-Si layer to a thickness of 1.0μ on the above n-type a-Si layer. Further, on said n$^-$-type a-Si layer, there was formed a n-type a-Si layer similar to that as described above to a thickness of 100 Å. During the glow discharging vapor deposition operation, the substrate was maintained at 300° C.

After the aluminum electrode, n-type a-Si layer, n$^-$-type a-Si layer and n-type a-Si layer were formed as described above on the substrate 702, the colorant layers of three colors were formed respectively on the n-type a-Si layer according to a desired pattern by the same method as described above. Thereafter, In$_2$O$_3$ transparent electrode was formed on the colorant layers. Then, with vacuum being broken, the substrate was taken out from the vacuum tank and coated with the photoresist OMR-83 (trade name: produced by Tokyo Oka). By exposure of the light from a mercury lamp through an image element pattern, followed by development, an image element pattern of the photoresist was formed on the In$_2$O$_3$ transparent electrode.

As the next step, etching of the In$_2$O$_3$ transparent electrode and the a-Si photoconductive layer was performed according to the process as already described.

In the above Example, photoconductive layers of a-Si and colorant layers were formed in a layered structure, which are sandwiched between a pair of electrodes, and the photoconductive layers constituted of a-Si are individually independent. With such constitution, leak of current from photoconductive layers of a-Si or colorant layers can be prevented. Thus, it is possible to obtain electric signals free from noise in detection of the output photocurrent.

As described above, in the photoelectric converting device according to the present invention, by arrangement in an array of colorant layers of various colors selected as desired on the photoconductive layer consisting of a-Si, spectral sensitivity distribution can be varied freely at the laminated portions between respective colorant layers and the photoconductive layer of a-Si. Hence, there can be obtained with ease a photoelectric converting device having desired color separation characteristics and spectral sensitivities.

Further, according to the present invention, the maximum spectral sensitivity wavelength can be shifted by some ten microns and also the photocurrent can be controlled by control of the concentration of the dye or the pigment contained in the colorant layers, and therefore it is possible to set any desired spectral sensitivity distribution and photocurrent for each color. For example, in green(G) colorant layer, the quantity of colorant can be increased twice as much as that of red(R) colorant layer and blue(B) colorant layer to form a photoelectric converting device having a spectral sensitivity approximate to visual sensitivity distribution.

In the photoelectric converting device described with reference to the embodiments as shown in FIGS. 1 through 7, the pattern of arrangement was one wherein respective colorant layers were arranged in an array. But the pattern of arrangement is not limited to such arrangement in the present invention, but there may also be employed a pattern in which each of colorant layers B, G and R is arranged in a two-dimensional matrix, as shown in FIG. 10.

We claim:

1. A photoelectric converting device comprising:
   a substrate;
   a photoconductive layer having a plurality of image elements and comprising an amorphous material having silicon atoms as a matrix;
   a plurality of variously colored colorant layers provided directly on said photoconductive layer, one such colorant layer provided separately for each said image element;
   a plurality of image element electrodes provided on said respective colorant layers for taking out electric signals separately for said respective image elements corresponding to light signals inputted to said photoconductive layer; and
   a plurality of counter-electrodes, one such counter-electrode coupled with each of said image element electrodes.

2. A photoelectric converting device according to claim 1, wherein said photoconductive layer is arranged on said substrate by being separated into sections per respective image elements corresponding to respective colorant layers.

3. A photoelectric converting device according to claim 1, wherein said photoconductive layer is provided on said substrate as a layer common to said colorant layers.

4. A photoelectric converting device according to claim 1, wherein said counter-electrodes are provided in a layer common to said colorant layers.

5. A photoelectric converting device according to claim 1, wherein said counter-electrodes are provided independently per respective colorant layers.

6. A photoelectric converting device according to claim 1, wherein respective counter-electrodes are provided in parallel with respective image element electrodes coupled with on corresponding colorant layers.

7. A photoelectric converting device according to claim 1, wherein said photoconductive layer and said colorant layer are held between said image element electrodes and said counter-electrodes.

8. A photoelectric converting device according to claim 1, wherein said photoconductive layer contains hydrogen atoms.

9. A photoelectric converting device according to claim 8, wherein said hydrogen atoms are present in an amount of 1 to 40 atomic %.

10. A photoelectric converting device according to claim 1, wherein said photoconductive layer contains halogen atoms.

11. A photoelectric converting device according to claim 10, wherein said halogen atoms are present in an amount of 1 to 40 atomic %.

12. A photoelectric converting device according to claim 1, wherein said photoconductive layer contains hydrogen atoms and halogen atoms.

13. A photoelectric converting device according to claim 12, wherein said hydrogen atoms and said halogen atoms are present in an combined amount of 1 to 40 atomic %.

14. A photoelectric converting device according to claim 1, wherein said photoconductive layer contains an impurity capable of determining the type of conduction as either p-type or n-type.

15. A photoelectric converting device according to claim 14, wherein said impurity is an element in group III of the periodic table.

16. A photoelectric converting device according to claim 15, wherein said impurity is present in an amount of $10^{-6}$ to $10^{-3}$ atomic %.

17. A photoelectric converting device according to claim 14, wherein said impurity is an element in group V of the periodic table.

18. A photoelectric converting device according to claim 17, wherein said impurity is present in an amount of $10^{-8}$ to $10^{-5}$ atomic %.

19. A photoelectric converting device according to claim 1, wherein each said colorant layer is a coated layer.

20. A photoelectric converting device according to claim 1, wherein each said colorant layer is a heat-transferred layer.

21. A photoelectric converting device according to claim 1, wherein each said colorant layer is a vapor-deposited layer.

22. A photoelectric converting device according to claim 21, wherein said vapor-deposited layer is 0.2 to 10μ thick.

23. A photoelectric converting device according to claim 1, wherein the colors of said colorant layers are selected from the group consisting of blue, red, green, yellow, magenta, and cyan.

24. A photoelectric converting device comprising:
a substrate;
a photoconductive layer having a plurality of image elements and comprising an amorphous material having silicon atoms as a matrix;
a plurality of variously colored colorant layers provided at a uniform distance from said photoconductive layer, one such colorant layer provided separately for each said image element;
a plurality of image element electrodes provided separately for said respective image elements for taking out electric signals corresponding to light signals inputted to said photoconductive layer; and
a plurality of counter-electrodes, one such counter-electrode coupled with each of said image element electrodes.

25. A photoelectric converting device according to claim 24, wherein said photoconductive layer is provided on said substrate as a layer common to said colorant layers.

26. A photoelectric converting device according to claim 24, wherein said counter-electrodes are provided in a layer common to said colorant layers.

27. A photoelectric converting device according to claim 24, wherein said counter-electrodes are provided independently for respective colorant layers.

28. A photoelectric converting device according to claim 24, wherein respective counter-electrodes are provided in parallel with respective image element electrodes coupled with on corresponding colorant layers.

29. A photoelectric converting device according to claim 24, wherein said photoconductive layer and said colorant layer are held between said image electrodes and said counter-electrodes.

30. A photoelectric converting device according to claim 24, wherein said photoconductive layer contains hydrogen atoms.

31. A photoelectric converting device according to claim 30, wherein said hydrogen atoms are present in an amount of 1 to 40 atomic %.

32. A photoelectric converting device according to claim 24, wherein said photoconductive layer contains halogen atoms.

33. A photoelectric converting device according to claim 32, wherein said halogen atoms are present in an amount of 1 to 40 atoms %.

34. A photoelectric converting device according to claim 24, wherein said photoconductive layer contains hydrogen atoms and halogen atoms.

35. A photoelectric converting device according to claim 34, wherein said hydrogen atoms and said halogen atoms are present in a combined amount of 1 to 40 atomic %.

36. A photoelectric converting device according to claim 24, wherein said photoconductive layer contains an impurity capable of determining the type of conduction as either p-type or n-type.

37. A photoelectric converting device according to claim 36, wherein said impurity is an element in group III of the periodic table.

38. A photoelectric converting device according to claim 37, wherein said impurity is present in an amount of $10^{-6}$ to $10^{-3}$ atomic %.

39. A photoelectric converting device according to claim 36, wherein said impurity is an element in group V of the periodic table.

40. A photoelectric converting device according to claim 39, wherein said impurity is present in an amount of $10^{-8}$ to $10^{-5}$ atomic %.

41. A photoelectric converting device according to claim 24, wherein each said colorant layer is a coated layer.

42. A photoelectric converting device according to claim 24, wherein each said colorant layer is a heat-transferred layer.

43. A photoelectric converting device according to claim 24, wherein each said colorant layer is a vapor-deposited layer.

44. A photoelectric converting device according to claim 43, wherein said vapor-deposited layer is 0.2 to 10μ thick.

45. A photoelectric converting device according to claim 24, wherein the colors of said colorant layers are selected from the group consisting of blue, red, green, yellow, magenta, and cyan.

46. A photoelectric converting device according to claim 24, wherein said photoconductive layer is separated into sections per respective image elements corresponding to respective colorant layers.

* * * * *

UNITED STATES PATENT AND TRADEMARK OFFICE
CERTIFICATE OF CORRECTION

PATENT NO. : 4,430,666

DATED : February 7, 1984

INVENTOR(S) : HISASHI NAKATSUI, YOSHIOKI HAJIMOTO

It is certified that error appears in the above-identified patent and that said Letters Patent is hereby corrected as shown below:

Column 4, line 46, change "$Si_3H'_8$" to --$Si_3H_8$,--.

Column 7, line 27, change "Cupper" to --Copper--.

Column 7, line 63, change "ltd" to --Ltd--.

Column 8, line 19, change "Toko" to --Toyo--.

Column 12, line 12, change "NCl" to --HCl--.

Column 12, line 22, change "difficulty" to --difficultly--.

Column 12, line 32, change "a" (first occurrence) to --an--.

Column 12, line 51, change "a" to --an--.

Column 12, line 59, change "a" to --an--.

Column 14, line 45, change "an" to --a--.

Signed and Sealed this

Seventeenth Day of July 1984

[SEAL]

Attest:

GERALD J. MOSSINGHOFF

Attesting Officer

Commissioner of Patents and Trademarks